(12) United States Patent
Reaves

(10) Patent No.: US 6,188,248 B1
(45) Date of Patent: Feb. 13, 2001

(54) OUTPUT SYNCHRONIZATION-FREE, HIGH-FANIN DYNAMIC NOR GATE

(75) Inventor: Jimmy Lee Reaves, San Jose, CA (US)

(73) Assignee: MIPS Technologies, Inc., Mountain View, CA (US)

( * ) Notice: Under 35 U.S.C. 154(b), the term of this patent shall be extended for 0 days.

(21) Appl. No.: 09/383,401

(22) Filed: Aug. 26, 1999

(51) Int. Cl.[7] ............... H03K 19/096; H03K 19/20; H03K 19/094
(52) U.S. Cl. ............... 326/98; 326/112; 326/44
(58) Field of Search ............... 326/98, 95, 93, 326/112, 119, 121, 122, 44, 49

(56) References Cited

U.S. PATENT DOCUMENTS

| | | | |
|---|---|---|---|
| 4,764,691 | * 8/1988 | Jochem | 326/45 |
| 5,117,130 | * 5/1992 | Shoji | 326/34 |
| 5,291,076 | * 3/1994 | Bridges et al. | 326/52 |
| 6,060,910 | * 5/2000 | Inui | 326/98 |

* cited by examiner

Primary Examiner—Michael Tokar
Assistant Examiner—James H. Cho
(74) Attorney, Agent, or Firm—Sterne, Kessler, Goldstein & Fox, P.L.L.C.

(57) ABSTRACT

An output synchronization-free NOR gate detects the all-zero scenario for an n-bit word. The n-bit word having a selected bit that is defined using a high-inactive convention, and (n−1) non-selected bits that are defined using a high-active convention. The NOR gate includes an output FET, a pre-charging circuit, a first evaluation circuit, and (n−1) second evaluation circuits. The pre-charging circuit charges the output FET gate, drain, and source to a pre-charge voltage during a low clock cycle. During a clock high cycle, the first evaluation circuit evaluates the selected bit and discharges the pre-charge voltage on the output FET source if the selected bit is a voltage high. The (n−1) second evaluation circuits evaluate the non-selected bits and maintain the pre-charge voltage on the output FET gate if each of the non-selected bits is a voltage low. The output FET conducts if the pre-charge voltage is maintained on the output FET gate and if the output FET source is discharged to ground. The drain of the output FET discharges to a low voltage if the output FET conducts, which indicates the all-zero scenario for the n-bit word.

21 Claims, 11 Drawing Sheets

CONVENTIONAL NOR GATE

CLOCK FOR CONVENTIONAL NOR GATE

OUTPUT FOR CONVENTIONAL NOR GATE

FIG. 3C

| VOLTAGE VALUE | LOGICAL VALUE |
|---|---|
| RELATIVE VOLTAGE LOW [e.g. 0v] | "1" |
| RELATIVE VOLTAGE HIGH [e.g. 3v] | "0" |

FIG. 3D

| VOLTAGE VALUE | LOGICAL VALUE |
|---|---|
| RELATIVE VOLTAGE LOW [e.g. 0v] | "0" |
| RELATIVE VOLTAGE HIGH [e.g. 3v] | "1" |

- 402 INVERTING A SELECTED BIT OF THE n-BIT WORD
- 304 GENERATING A PRE-CHARGE VOLTAGE
- 306 EVALUATING THE SELECTED BIT USING THE HIGH-INACTIVE CONVENTION, AND THE NON-SELECTED BITS USING A HIGH-ACTIVE CONVENTION

FIG. 6

600 — Inputs

| in1 (volts) | in2-inN (volts) | Output FET 522 Status | Node 532 (volts) | Output Node 536 (volts) |
|---|---|---|---|---|
| HIGH | all LOW | Conducting | LOW | HIGH |
| HIGH | one or more HIGH | Non-conducting | HIGH | LOW |
| low | all LOW | Non-conducting | HIGH | LOW |
| low | one or more HIGH | Non-conducting | HIGH | LOW |

(rows labeled 602, 604, 606, 608)

FIG. 7B

704 — Inputs

| in1 (volts) | in2-inN (volts) | Output FET 522 Status | Node 532 (volts) | Output Node 536 (volts) |
|---|---|---|---|---|
| Low | all LOW | Conducting | LOW | HIGH |
| Low | one or more HIGH | Non-conducting | HIGH | LOW |
| HIGH | all LOW | Non-conducting | HIGH | LOW |
| HIGH | one or more HIGH | Non-conducting | HIGH | LOW |

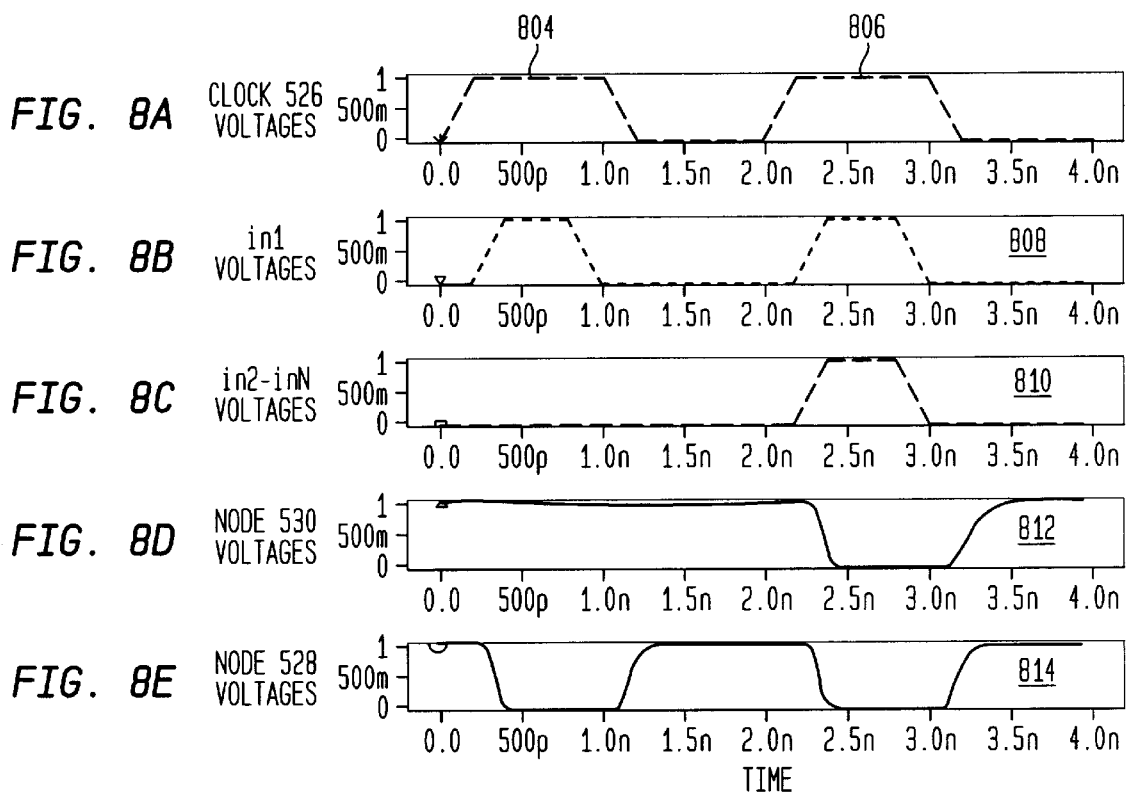
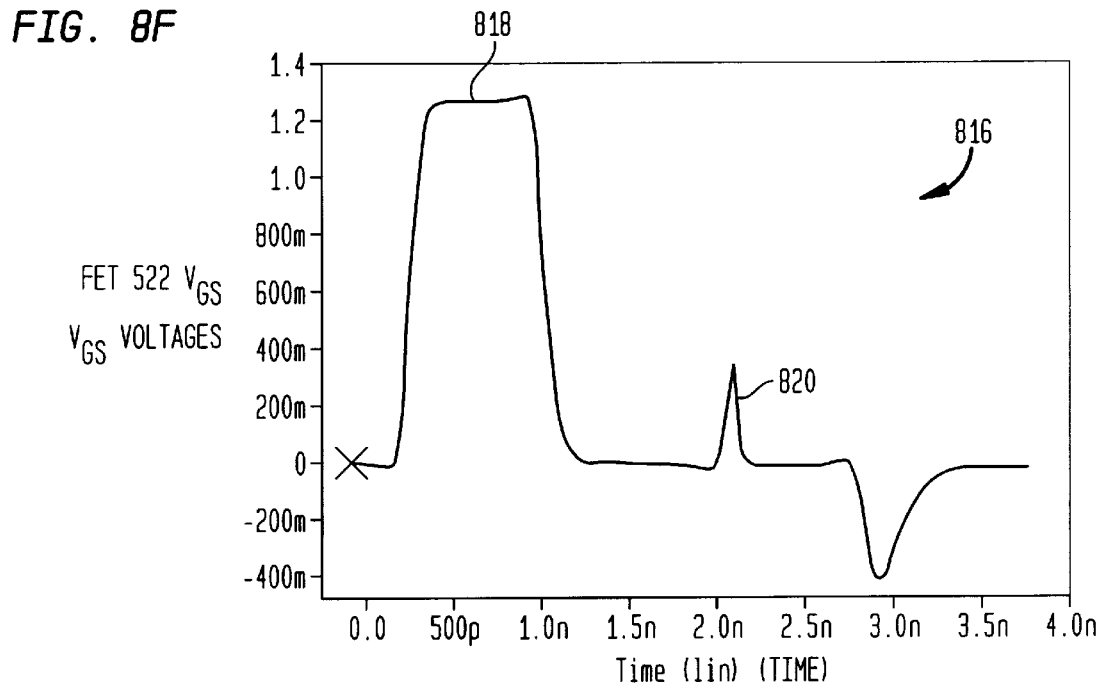

OUTPUT SYNCHRONIZATION-FREE, HIGH-FANIN DYNAMIC NOR GATE

BACKGROUND OF THE INVENTION

1. Field of the Invention

This invention relates generally to logic gates. More particularly, the invention relates to a high-fanin NOR gate that does not require a synchronization event before the output can be sampled.

2. Related Art

In digital circuits, it is often necessary to generate the logical NOR of a large number of input signals. Such circuits with a large number of inputs are often referred to as high fanin circuits. Example circuits include zero detect circuits in Arithmetic Logic Units (ALUs), Cache Tag Comparators, and Programmable Logic Arrays, where the number of inputs can be 16 or more.

For power and speed considerations, the conventional implementation of such a NOR logic gate is a dynamic MOS NOR circuit. The output node of the dynamic MOS NOR circuit is pre-charged to a known high state. If any input to the circuit is active (or true or logic "1"), the output switches to a low state.

A scenario of special interest is that in which all the circuit inputs are inactive, as in the case of a zero detector designed to detect all zeroes for a number of input signals. In this case, the conventional MOS NOR gate makes no state change on its output. Therefore, it is difficult to distinguish the pre-charged state from the evaluated, all zero input state by observing only the output. Often, it is necessary for an external agent to make the distinction based on an elapsed time period. For example, once the output pre-charge is complete, the external agent observes the output node after an elapsed time-period. If the output is still in the pre-charged state, then the logic gate has probably evaluated a complete set of inputs, and the all-zero case is in effect. The arbitrary point (in time) of evaluation is often referred to as a synchronization point or a synchronization event.

The issue is how much elapsed time is enough before the synchronization event? If the elapsed time interval is too short, then the circuit output might be erroneously sampled before all the inputs have been updated. If the interval is too long, then valuable time is wasted. As processor clock frequencies increase, it is extremely important not to waste time in delay paths.

SUMMARY OF THE INVENTION

The present invention is directed toward a method, system, and apparatus for detecting an all-zero scenario for an n-bit word. The all-zero scenario occurs when all bits of the n-bit word are determined to be logic "0".

According to the invention, a high-inactive convention is defined for a selected bit of the n-bit word, and a high-active convention is defined for the remaining bits of the n-bit word. The high-inactive convention represents a logic "0" as a voltage high and represents a logic "1" as a voltage low. The high-active convention represents a logic "0" as a voltage low and represents a logic "1" as a voltage high. The invention generates a pre-charge voltage during a low clock cycle. During a high clock cycle, the invention evaluates the logic state of the selected bit using the high-inactive convention, and the logic state of the non-selected bits using the high-active convention. Specifically, the invention determines the voltage of the selected bit, and each of the non-selected bits. The invention discharges the pre-charge voltage if the selected bit is a voltage high, and each of the non-selected bits is a voltage low, whereby the discharge of the pre-charge voltage indicates the all-zero scenario. The invention maintains the pre-charge voltage if the selected bit is a voltage low or any one of the non-selected bits is a voltage high.

In one embodiment, the invention is implemented in an output synchronization-free NOR gate. The NOR gate includes an output FET, a pre-charging circuit, a first evaluation circuit, and (n−1) second evaluation circuits.

The NOR gate operates as follows. During the low clock cycle, the pre-charging circuit charges the output FET gate, drain, and source to a pre-charge voltage. An inverter inverts the pre-charge voltage on the output FET drain, producing a voltage low on the NOR gate output during the low clock cycle.

During the high clock cycle, the first evaluation circuit evaluates the selected bit, and the second evaluation circuits evaluate their corresponding non-selected bits. The first evaluation circuit discharges the pre-charge voltage on the output FET source if the selected bit is a voltage high. The (n−1) second evaluation circuits maintain the pre-charge voltage on the output FET gate if each of the non-selected bits is a voltage low. The output FET conducts (i.e., is ON) if the pre-charge voltage is maintained on the output FET gate and if the output FET source is discharged to a low voltage. The drain of the output FET discharges to a low voltage when the output FET conducts, which indicates the all-zero scenario. The inverter coupled to the output FET drain inverts the voltage on the output FET drain, producing a transition from a voltage low to a voltage high on the NOR gate output for the all zero scenario.

If the selected bit is voltage low, then the first evaluation circuit maintains the pre-charge voltage on the output FET source, thereby preventing the output FET from conducting. If one or more of the non-selected bits is a voltage high, then the respective second evaluation circuit (with the high input) discharges the gate voltage on the output FET, thereby preventing the output FET from conducting.

In one embodiment, the first evaluation circuit includes a means for adjusting the discharge rate of the output FET source voltage, as a function of the output FET gate voltage. More specifically, the source discharge rate varies inversely with gate voltage. This prevents the unintentional spurious conduction of the output FET when both the source and gate of the output FET are being discharged, simultaneously.

An advantage of the present invention is that the NOR gate output can be sampled without requiring a synchronization event. This results because the NOR gate output is a voltage low during the low clock cycle. The NOR gate output transitions from a voltage low to a voltage high during the high clock cycle only when the all-zero scenario is detected. As such, the NOR gate output for the all-zero scenario is distinct from that of the low clock cycle, and therefore no synchronization event is necessary before sampling the NOR gate output.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings, wherein:

FIG. 3C is a diagram depicting the high-inactive convention;

FIG. 3D is a diagram depicting the high-active convention;

FIG. 4 is a diagram of an operational flowchart illustrating a process for detecting an all-zero scenario for an n-bit word according to an embodiment of the invention;

FIG. 6 is a diagram illustrating a table that is associated with NOR gate 500;

FIG. 7B is a diagram illustrating a table that is associated with NOR gate 700;

FIGS. 8A–8F illustrate various signal diagrams related to NOR gate 500;

DETAILED DESCRIPTION OF THE EMBODIMENTS

1. Overview and Discussion of the Invention

The present invention is directed toward a method, system, and apparatus for detecting the all zero scenario for an n-bit word without requiring a synchronization event. According to the invention, a selected bit of the n-bit word is defined using a high-inactive convention, and the remaining bits are defined using a high-active convention. A pre-charge voltage is generated during a low clock cycle. During a high clock cycle, the pre-charge voltage is discharged if the selected bit is a voltage high and each non-selected bit is a voltage low. The discharge of the pre-charge voltage during the high clock cycle indicates the all-zero scenario.

2. Example Environment

Figure 1:
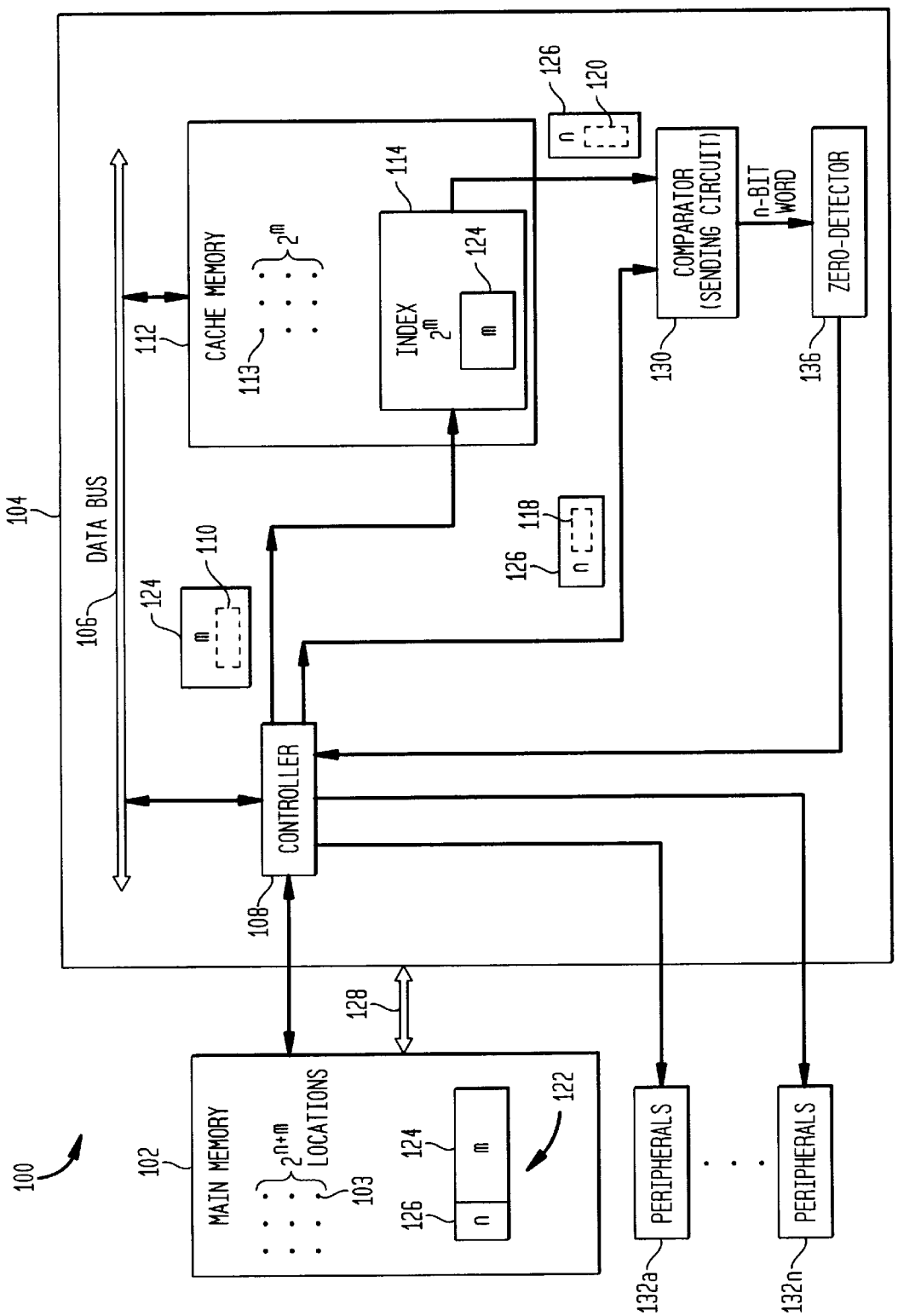
FIG. 1 is a diagram illustrating an example environment of the invention.

Before describing the invention in detail, it is useful to describe an example environment for the invention. FIG. 1 is a block diagram illustrating an example environment comprising computer system 100. Referring now to FIG. 1, computer system 100 includes at least a main memory 102, a processor chip 104, peripherals 132*a–n*, and a data bus 128. Processor chip 104 includes a data bus 106, a controller 108, a cache memory 112 having an index 114, a comparator 130, and a zero-detector 136. Main memory 102 is a permanent "off chip" memory for processor 104 that is accessed through data bus 128. Main memory 102 has $2^{n+m}$ memory locations 103, each identified by a corresponding memory address 122. Address 122 has an m-portion 124 that is the least significant m-bits in the address, and an n-portion 126 that is the most significant n-bits in the address, as shown in FIG. 1. Cache memory 112 is a temporary "on chip" memory for processor 104 that is accessed using data bus 106. Cache memory 112 has $2^m$ memory locations 113, and holds a subset of the data stored in main memory 102.

The relationship between the main memory 102 and the cache memory 112 is as follows. As stated above, main memory 102 has $2^{n+m}$ memory locations 103, and cache memory 112 has $2^m$ memory locations 113, where cache memory 112 stores a subset of the data stored in main memory 102. For example, if n=4 and m=5, then main memory 102 stores 512 bytes of data and cache memory 112 stores 32 bytes of the 512 bytes of data currently stored in main memory 102. Each cache memory location 113 is identified by a corresponding memory address 124, which is the same as the m-portion 124 of main memory address 122. As such, a single cache memory location 113 (and address 124) maps to a range of main memory locations 103 (and addresses 122). This is necessary since the cache memory 112 holds only a subset of the data in the main memory 102.

As discussed, a single cache address 124 maps to a range of main memory addresses 122, but only one address of the range is active and stored in the cache memory 112 at any one time. Index 114 catalogs the mapping of the cache memory 112 to the main memory 102. In other words, index 114 keeps track of the n-portion 126 that currently paired with the m-portion 124 in the cache memory 112. This allows the controller 108 to access some of the data in the main memory 102 from the cache memory 112. This is preferred, because cache memory 112 is "on-chip" and therefore is faster to access than main memory 102.

To determine if a specific address 122 is currently stored in cache memory 112, controller 108 must determine the n-portion 126 that is currently paired with a specific m-portion 124 in cache index 114. To do so, controller 108 sends an m-portion 124 (having example bit pattern 110) to index 114, and sends n-portion 126 (having example bit pattern 118) to comparator 130. Index 114 retrieves the stored n-portion 126 (with bit pattern 120) that corresponds to m-portion 124 (with bit pattern 110), and sends it to comparator 130. Comparator 130 compares each bit in bit pattern 118 with each bit in bit pattern 120, and outputs a logic "0" for each match, and logic "1" for each mismatch. This results in an n-bit word that represents the individual bit match results. Comparator 130 then sends the n-bit word to zero-detector 136. Zero-detector 136 determines whether the n-bit word from the comparator 130 is all logic "0"s, which indicates a match between the desired bit pattern 118 and the stored bit pattern 120. Zero-detector 136 then sends the overall match result to controller 108. If the zero-detector 136 indicates a match, then controller 108 can retrieve the desired data from cache memory 112 over bus 106 and take advantage of the speed improvement over main memory 102.

In the example environment above, the zero-detector 136 determines if the n-bit word from comparator 130 is all logic "0"s, which indicates a match between the desired and stored n-portions of addresses 122. More generally, comparator 130 may be described as a sending circuit that sends n-bit words to zero detector 136 for evaluation. The zero-detector 136 may be a high fan-in NOR gate as described in the invention description below. Description of this example environment is provided for convenience only, and is not intended to limit the invention in any way. In fact, after reading the invention description, it will become apparent to a person skilled in the relevant arts how to implement the invention in alternate environments.

3. Conventional High Fanin NOR Gate

Before describing the invention in detail, it is useful to describe a conventional high fanin NOR gate. A high fanin NOR gate operates as conventional NOR gate that has a large number of inputs. As such, a high fanin NOR gate generates an output logic "1", if and only if, all the inputs are logic "0".

Figure 2A:
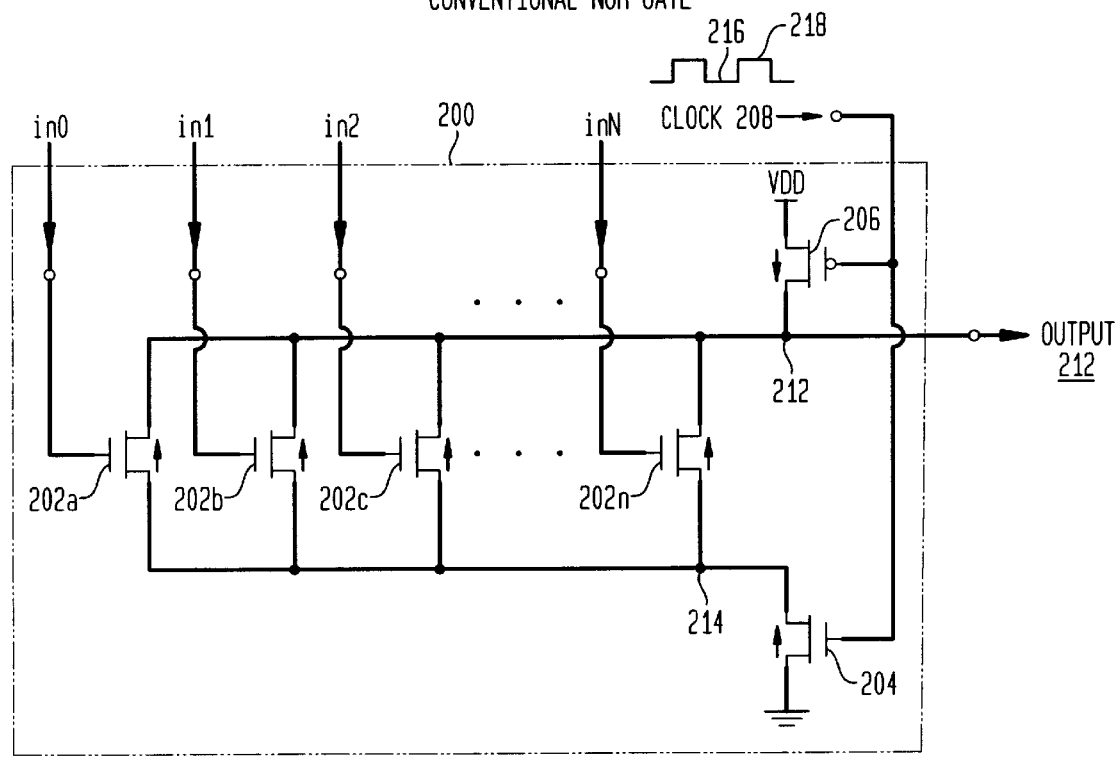
FIG. 2A is a circuit diagram illustrating a conventional NOR gate 200.

FIG. 2A illustrates conventional high fanin NOR gate 200 that is constructed using field effect transistors (or FETs). NOR gate 200 includes: n-channel FETs (or "N-FETs") 202a–n, N-FET 204, and p-channel FET (or "P-FET") 206. Throughout this application, P-FETs are distinguished from N-FETs (in the Figures) by a circle on the P-FET gate. Also in the Figures, the head of the FET "arrow" points to the drain of device for both the P-FETs and N-FETs. The source and drain for both P-FET and N-FET devices are generally interchangeable.

NOR gate 200 receives multiple input signals in0–inN, and generates an output of logic "1", if and only if, all the input signals are a logic "0". This is often referred to as the "all-zero scenario" because the input signals are all logic "0". The all-zero scenario is often of special interest in digital circuits as described in the example environment, above. If any one of the input signals is a logic "1", then NOR gate 200 generates a logic "0".

Nor gate 200 operates as follows. NOR gate 200 receives a clock signal 208 having an alternating low clock signal 216 and high clock signal 218, as shown. Clock signal 208 controls the gate of P-FET 206, and the gate of N-FET 204. P-FET 206 and N-FET 204 operate as a switches, which are either conducting or non-conducting as controlled by clock signal 208. This occurs because P-FETs conduct when their gate-to-source voltage ($V_{GS}$) is below their inherent threshold voltage, and N-FETs conduct when their $V_{GS}$ is above their inherent threshold voltage. The respective threshold voltages for the P-FETs and N-FETs are process dependant as will be understood by those skilled in the relevant arts.

During the low clock cycle 216, P-FET 206 conducts and output node 212 charges (or pre-charges) to the power supply voltage $v_{dd}$. Therefore, output node 212, which is the output of NOR gate 200, is pre-charged to the power supply $v_{dd}$ during the low clock cycle 216. Also during the low clock cycle 216, N-FET 204 is cutoff (or does not conduct) so that node 214 floats. This prevents the discharge of node 212 to ground during the low clock cycle, which may occur if one of FETs 202 conduct.

During the high clock cycle 218, P-FET 206 cuts-off, and N-FET 204 conducts and therefore pulls node 214 to ground. The instant after P-FET 206 cuts-off (at the leading edge of high clock cycle 218), pre-charge voltage $v_{dd}$ will remain on output node 212. However, the voltage state of node 212 over the remainder high clock cycle 218 is dependent on the inputs in0–inN. Inputs in0–inN control the gates of N-FETs 202a–202n, where N-FETs 202a–n operate as switches that are controlled by their respective input signals. If one or more input signals is logic "1" (voltage high), the respective N-FET 202 conducts and shorts output node 212 to ground. If all input signals in0–inN are logic 0 (voltage low), then output node 212 maintains the voltage $v_{dd}$, which indicates the all-zero scenario.

As described above, the all zero scenario produces a voltage $v_{dd}$ on the output node 212. Therefore, the all-zero scenario produces the same voltage on the output node 212 as the pre-charge voltage that is built up during the clock low 216. For an external circuit that is sampling the output node 212, this results is an ambiguity. The ambiguity is that the external circuit cannot determine whether $v_{dd}$ on the output node 212 represents the all-zero scenario, or whether $v_{dd}$ represents the continuation of the pre-charge state. The ambiguity occurs because it cannot be determined, solely by sampling the output node 212, whether all the input signals in0–inN have fully updated.

Figure 2B:
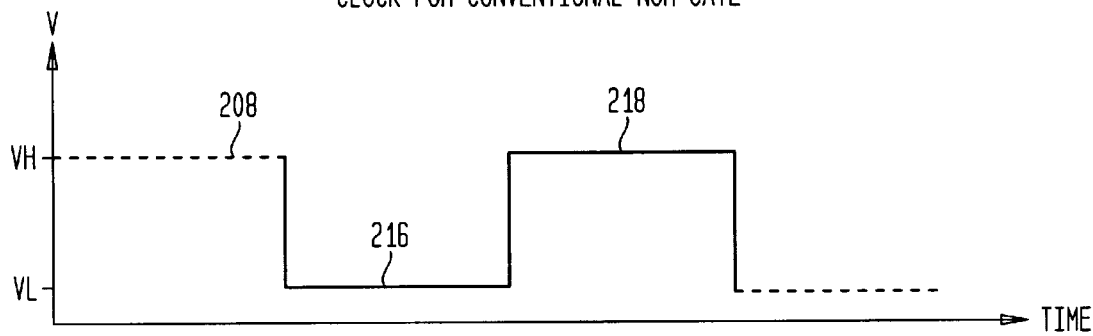
FIGS. 2B–2C depict several signal diagrams associated with NOR gate 200.
Figure 2C:
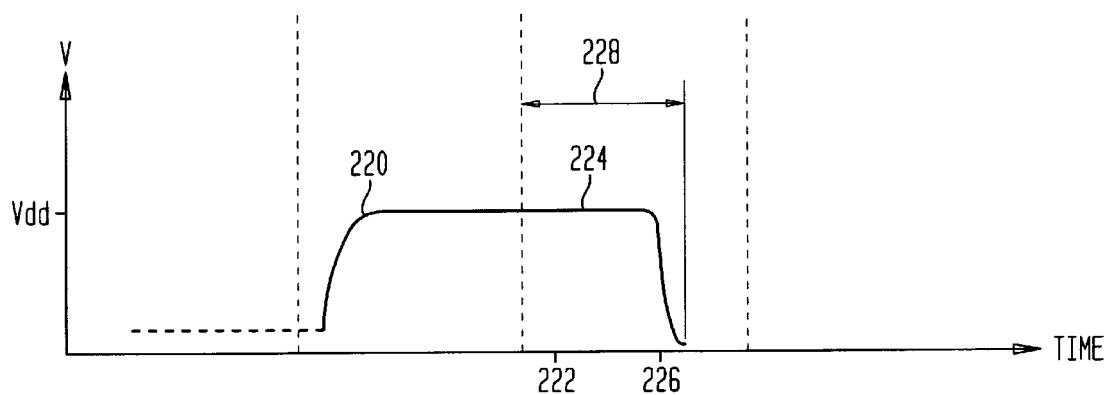

The mentioned ambiguity is further illustrated in FIGS. 2B–2C. FIG. 2B depicts clock signal 208 having low clock cycle 216 and high clock cycle 218. FIG. 2C illustrates output signal 220, as an example signal that appears at node 212 in FIG. 2A. As shown, signal 220 pre-charges during low clock cycle 216 to $V_{dd}$. During a portion of the high clock cycle 218, the output signal 220 remains at $v_{dd}$, until an input signal updates to a logic 1" (high voltage) at time 226 and shorts node 212 (and signal 220) to ground. The ambiguity occurs when sampling the output signal 220, for example, at time 222, resulting in a sample 224 having a voltage $v_{dd}$. It is unknown whether sample 224 is a true reflection of the all-zero scenario with all inputs updated, or whether one or more inputs in0–inN might update after time 222, and short node 212 (and signal 220) to ground. As illustrated by FIG. 2B, when the later occurs, sampling at time 222 gives a erroneous result.

The conventional solution to the time ambiguity associated with NOR gate 200 is to simply implement a waiting period 228, during which the output node 212 is not sampled. This is typically done by a lock-out circuit (not shown) that prevents sampling during the waiting period 228. The actual time chosen to sample the output node 212 is often referred to as a synchronization event. It will be apparent that the longer the waiting period 228, the more likely the inputs in0–inN have updated, and therefore node 212 is in its final voltage state (for that clock cycle). If all the inputs in0–inN update prior to the end of waiting period 228, then the excess time is wasted. As processor clock frequencies increase, it is extremely important not to waste time in delay paths.

4. Synchronization-Free Zero Detection

Synchronization-free zero detection is now described according to several embodiments of the present invention. In general terms, an n-bit word is received from a sending circuit, and the all-zero scenario for the n-bit word is detected without requiring a synchronization event. This is done by generating a pre-charge voltage before the n-bit word is evaluated, and then discharging the pre-charge voltage, if and only if, all bits in the n-bit are evaluated to a logic "0".

Figure 3A:
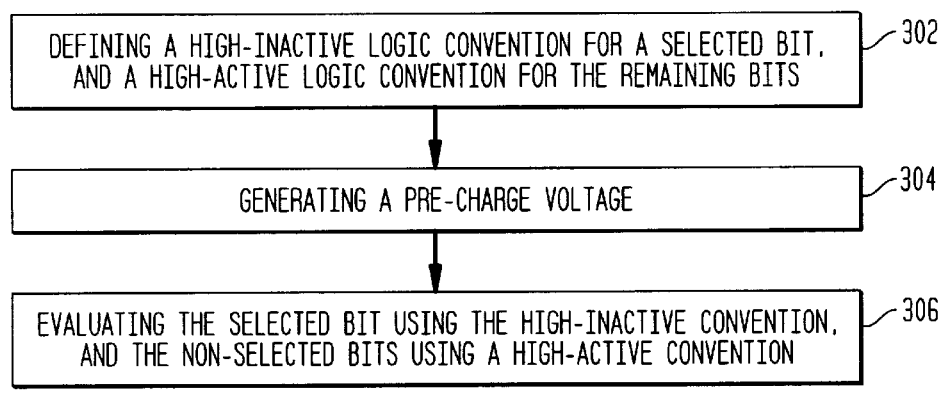
FIGS. 3A–3B are diagrams of an operational flowchart illustrating a process for detecting an all-zero scenario for an n-bit word according to an embodiment of the invention.

FIG. 3A is a high-level operational flowchart 300 for detecting the all-zero scenario for an n-bit word according to one embodiment of the invention. More detailed structural descriptions of the invention are discussed in following sections.

In step 302, a high-inactive logic convention is defined for a selected bit of the n-bit word, and a high-active logic convention is defined for the remaining non-selected bits. The logic conventions map physical voltage values to logical values as will be described below. In one embodiment, this step is done by agreeing with the sending circuit that a high-inactive convention will be used for the selected bit, and a high-active convention will be used for the remaining bits. The selected bit can be any bit of the n-bit word, including but not limited to the least significant bit (LSB) and the most significant bit (MSB).

As stated, the logic conventions map physical voltage values to logical values. FIG. 3C illustrates the high-inactive convention, and FIG. 3D illustrates the high-active convention. In the high-inactive convention, a voltage low represents a logic "1", and a voltage high represents a logic "0". In the high-active convention, a voltage low represents a logic "0" and a voltage high represents a logic "1". The low and high voltage values are relative to each other. Therefore, an example low voltage value may be approximately 0 volts for a corresponding high voltage of approximately 3 v.

As stated above, in one embodiment, step 302 is performed by agreeing with sending circuit (for example comparator/sending circuit 130) that the selected bit of the n-bit word is defined as high-inactive, and the remaining bits are defined as high-active. Therefore, whenever a sending circuit intends to send a logic "1" for the selected bit, it sends a voltage low. Whenever the sending circuit intends to send a logic "0" for the selected bit, it sends a voltage high. For the non-selected bits, whenever the sending circuit intends to send a logic "0", it sends a voltage low. Whenever the sending circuit intends to send a logic "1" for a non-selected bit, it sends a voltage high. The sending circuit can implement this convention in a number of ways including, but not limited to, inverting the selected bit prior to transmission.

In step 304, a pre-charge voltage is generated. In one embodiment as will be shown, the pre-charge voltage is generated on the drain of an output FET.

Figure 3B:
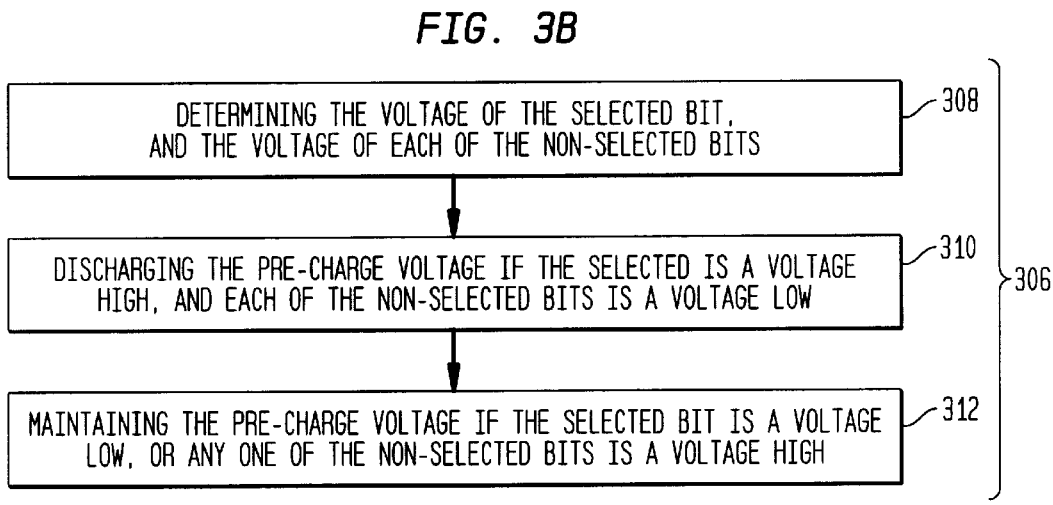

In step 306, the selected bit is evaluated using the high-inactive convention, and each of the non-selected bits is evaluated using the high-active convention. Preferably, step 306 includes steps 308–312 shown in FIG. 3B. In step 308, the voltage is determined for the selected bit, and the voltage is determined for each of the non-selected bits. In step 310, the pre-charge voltage is discharged if the selected bit is a voltage high and the voltage of the each of the non-selected bits is a voltage low. In step 312, the pre-charge voltage is maintained if the selected bit is a voltage low or any one of the non-selected bits is a voltage high.

In one embodiment, the steps in flowchart 300 are associated with a clock signal. More specifically, step 304 is done during a low clock signal, and step 306 (including steps 308–312) are done during a high clock signal.

As stated, step 302 in flowchart 300 can be accomplished by agreement with the sending circuit that the high-inactive convention is to used for the selected bit, and the high-active convention is to be used for the non-selected bits. Alternatively, there can be no agreement with the sending circuit. In which case, the sending circuit sends each bit of the n-bit word using the high-active convention (voltage high represents a logic "1", and voltage low represents a logic "0"). This alternate embodiment is illustrated by flowchart 400 in FIG. 4. Flowchart 400 is identical to flowchart 300, except that step 302 is replaced by step 402. In step 402, the selected bit is inverted. The remaining steps in flowchart 400 are identical to that of flowchart 300, to which the reader is directed for further details.

5. Synchronization Free High Fan-In NOR Gate

Figure 5:
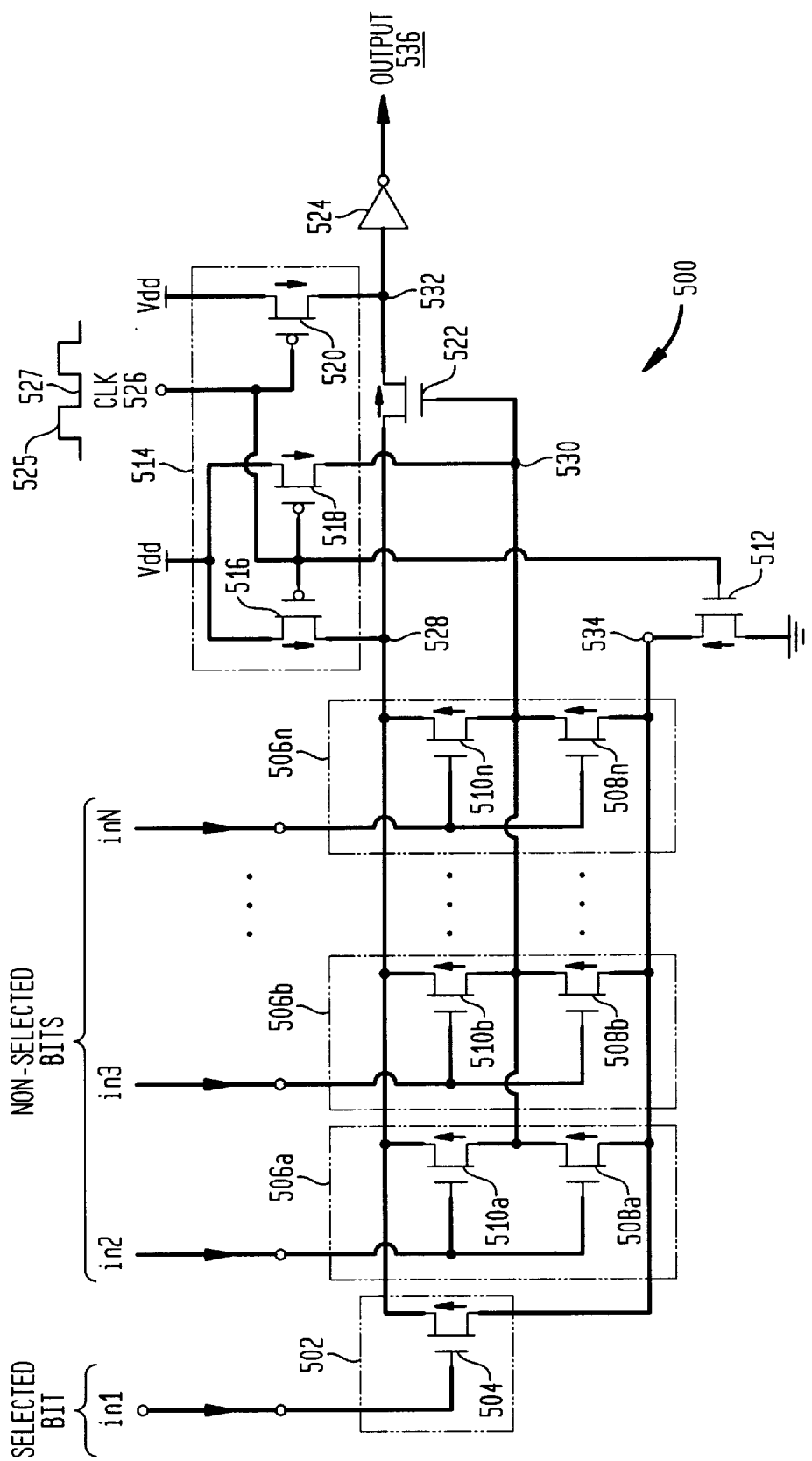
FIG. 5 is a diagram of an output synchronization-free NOR gate 500, according to an embodiment of the present invention.

FIG. 5 illustrates NOR gate 500 receiving an n-bit word having bits in1–inN. NOR gate 500 determines if the n-bit word is all logic zeros in a manner consistent with operational flowchart 300. In other words, NOR gate 500 is a structural embodiment that is consistent with operational flowchart 300. However, it should be understood that the scope and spirit of present invention includes other structural embodiments that will be apparent to those skilled in the arts based on the discussion herein.

At a high level, NOR gate 500 includes: evaluation circuit 502, evaluation circuits 506a–n, N-FET 512, pre-charge circuit 514, output N-FET 522, and inverter 524. As shown, evaluation circuit 502 is coupled to the source of output N-FET 522, and each of evaluation circuits 506a–n is coupled to the gate of output N-FET 522. (As stated above, the head of the arrow points to the drain of device for both the P-FETs and N-FETs. P-FETs are distinguished from N-FETs by a circle on the P-FET gate.)

In one embodiment, pre-charge circuit 514 includes P-FETs 516, 518 and 520. Each of the gates of P-FETs 516, 518, and 520 are tied to clock signal 526 having low clock cycle 527 and high clock cycle 525. Each of the drains of P-FETs 516, 518, and 520 are tied to the power supply voltage $v_{dd}$. The sources of P-FETs 516, 518, and 520 are tied to nodes 528, 530, and 532, respectively. Those skilled in the arts will recognize other embodiments for pre-charge circuit 514 based on the description given herein.

In one embodiment, evaluation circuit 502 (for the selected bit) includes N-FET 504. The gate of N-FET 504 is controlled by selected bit in1. The drain of N-FET 504 is tied to the source of output N-FET 522. The source of N-FET 504 is tied to node 534. Those skilled in the arts will recognize other embodiments for evaluation circuit 502 based on the description given herein.

In one embodiment, each evaluation circuit 506 (for the non-selected bits) includes a top N-FET 510 and a bottom N-FET 508. The gates of the top N-FET 510 and the bottom N-FET 508 are controlled by the corresponding input signal in2–inN, as shown in FIG. 5. The drain of top N-FET 510 is coupled to the source of output N-FET 522. The source of top N-FET 510 is coupled to the drain of bottom N-FET 508. The drain of the bottom N-FET 508 is coupled to the gate of output N-FET 522. The source of bottom N-FET 508 is coupled to node 534. Those skilled in the arts will recognize other embodiments for evaluation circuit 506 based on the description given herein.

The N-FETs in NOR gate 500 conduct for a high gate voltage when their gate-to-source voltage ($V_{GS}$) exceeds their inherent threshold voltage, and the P-FETs conduct for a low gate voltage when their $V_{GS}$ is below their inherent threshold voltage, as will be understood by those skilled in the relevant arts. The N-FETS and P-FETs in NOR gate 500 operate essentially as switches. Those skilled in the arts will recognize that other devices (including other types of transistors and other semiconductor devices) could be used for the N-FETs and P-FETs in NOR gates 500. The scope and spirit of the invention includes these other devices and embodiments. In one embodiment, the P-FETs and N-FETs in NOR gate 500 are produced using a CMOS process.

NOR gate 500 assumes that a selected bit of the n-bit word is defined with the high-inactive logic convention (FIG. 3C), and the remaining non-selected bits are defined with the high-active convention (FIG. 3D). NOR gate 500 is designed so that in1 is the selected bit, an in2–inN are the non-selected bits. In1 is chosen as the selected bit for illustration purposes only. NOR gate 500 could be configured so that any one of bits in1–inN is the selected bit, including but not limited to the least significant bit (LSB) or the most significant bit (MSB) of the n-bit word.

The operation of NOR gate 500 in detecting the all-zero scenario for an n-bit word is described below. NOR gate 500 is described for a low clock cycle 527 and a high clock cycle 525. During the high clock cycle 525, the NOR gate operation will be explored for a variety of input combinations.

During the low clock cycle 527, pre-charge circuit 514 generates a pre-charge voltage $v_{dd}$ at nodes 528, 530, and 532. More specifically, P-FETs 516, 518, and 520 conduct (during the low clock cycle) and connect nodes 528, 530, and 532 to the power supply voltage $v_{dd}$. The voltages on nodes 528, 530, and 532 are coupled to the source, gate, and drain of output N-FET 522, respectively. Output N-FET 522 does not conduct during the low clock cycle because the source, gate, and drain are at a common potential (i.e., $v_{dd}$). Inverter 524 inverts the pre-charge voltage $v_{dd}$ on node 532 so that the output node 536 is a voltage low during the low clock cycle 527. The low clock cycle 527 may be referred to as the pre-charge condition or pre-charge state, because the output N-FET is pre-charged during the low clock cycle.

N-FET 512 is cutoff (non-conducting) during the low clock cycle 527, and therefore node 534 is floating. Since N-FET 512 is cutoff, nodes 528 and 530 cannot discharge to ground during the low clock cycle, even if inputs in1–inN cause one or more of the evaluation circuits 502, 506 to conduct. In an alternative embodiment, node 534 is tied directly to ground, in which case N-FET 512 is unnecessary.

During the high clock cycle 525, pre-charge circuit 514 ceases to charge nodes 528, 530, and 532. More specifically, P-FETs 516, 518, and 520 are cutoff, so that the power supply voltage $v_{dd}$ is disconnected from the nodes 528, 530, and 532. As discussed below, these nodes maintain their voltage $v_{dd}$ unless altered by evaluation circuit 502 and/or one of evaluation circuits 506a–n. Evaluation circuit 502 evaluates the logic state of the selected bit using the high-inactive convention. Each evaluation circuit 506a–n evaluates the logic state of the corresponding non-selected bit based on the high-active convention. Also during the high clock cycle 525, N-FET 512 conducts and pulls node 534 to ground.

The various combinations of input signals in1–inN, and their effect during high clock cycle 525, will now be discussed. This will be done with reference to table 600 in FIG. 6. Table 600 summarizes the input combinations, output results, and intermediate operations of NOR gate 500. The input combinations are as follows: (1) in1 at a voltage high, and in2–inN at a voltage low; (2) in1 at a voltage high, and one or more of in2–inN at a voltage high; (3) in1 at a voltage low, and in2–inN at a voltage low; (4) in1 at a voltage low, and one or more of in2–inN at a voltage high. The reader is reminded that in1 is the selected bit for NOR gate 500.

Input combination 602 is in1 at a voltage high and in2–inN at a voltage low. This is the all-zero scenario using the high-inactive convention for the selected bit and high-active convention for the non-selected bits. When in1 is a voltage high, evaluation circuit 502 discharges node 528 and the source of output N-FET 522. More specifically, N-FET 504 conducts and shorts the source of output N-FET 522 to node 534, where node 534 is ground during high clock cycle 525. When in2–inN are a relative voltage low, none of evaluation circuits 506a–n discharge the pre-charge voltage on node 530, and therefore the pre-charged voltage $v_{dd}$ remains on the gate of output N-FET 522. More specifically, each N-FET 508 and N-FET 510 is cutoff, maintaining the gate voltage on the output N-FET 522. As such, the gate-to-source voltage ($V_{GS}$) on output N-FET 522 is sufficiently positive to cause output N-FET 522 to conduct. This discharges the $v_{dd}$ voltage on the output N-FET 522 drain to ground through N-FET 504. The discharge takes the node 532 to a relatively low voltage (e.g. approximately 0 volts). Inverter 524 inverts the low voltage on node 532, producing a relative high voltage at output node 536. The change in voltage of output node 536 from a low voltage to a high voltage indicates the all-zero scenario.

Input combination 604 is in1 at a voltage high and one or more of in2–inN at a voltage high. As in input combination 602, the relative high voltage on in1 causes evaluation circuit 502 to discharge node 528 and the source of output N-FET 522. When one or more of in2–inN is a voltage high, the respective evaluation circuit(s) 506 (with the high voltage) discharges node 530 and the gate of output N-FET 522. More specifically, the respective bottom FET(s) 508 and top FET(s) 510 conduct, where the respective bottom FET(s) 508 shorts the gate voltage on output N-FET 522 to ground. Since the gate and source are both discharging, output N-FET 522 will not conduct as long as the source discharge rate is less than or approximately equal to the gate discharge rate. (i.e., output N-FET 522 will not conduct so long as $V_{GS}$ does not become sufficiently positive.) Assuming that output N-FET 522 does not conduct, then the node 532 remains at the pre-charge voltage $v_{dd}$. Inverter 524 inverts the $v_{dd}$ voltage on node 532, producing a voltage low at the output node 536, as during the low clock cycle 527.

As stated, N-FET 522 does not conduct for input combination 604 as long the source discharge rate is less than or equal to the gate discharge rate. This is one reason for the top FETs 510. The top FETs 510 load down the source of N-FET 522 with additional capacitance, which slows the discharge of the source voltage because of the additional charge stored in the capacitance of the top FETs 510. Also, top FETs 510 provide a short circuit between nodes 528 and 530 for a respective high input, forcing the discharge rates of nodes 528 and 530 to more closely track.

Input combination 606 is in1 at a voltage low and in2–inN at a voltage low. When in1 is a voltage low, then the evaluation circuit 502 does not discharge node 528. More specifically, N-FET 504 does not conduct so that the source of N-FET 522 remains at the pre-charge voltage $v_{dd}$. As in input combination 602, when in2–inN are all at a voltage low, none of the respective evaluation circuits 506a–n discharge the voltage on node 530. More specifically, the bottom N-FETs 508 do not conduct, so the gate voltage on output N-FET 522 remains at the pre-charge voltage $v_{dd}$. The output N-FET 522 $V_{GS}$ remains approximately 0 volts because both the gate and source voltages are at a common potential (i.e., $v_{dd}$). Therefore, the output N-FET 522 does not conduct, and node 532 remains at the pre-charge voltage $v_{dd}$. Inverter 524 inverts the $v_{dd}$ voltage on node 532, producing a voltage low at the output node 536, as during the low clock cycle 527.

Input combination 608 is in1 at a voltage low and one or more of in2–inN is at a voltage high. When in1 is a voltage low, then the evaluation circuit 502 does not discharge node 528. More specifically, N-FET 504 does not conduct. When one or more of in2–inN are at a voltage high, then the respective evaluation circuit(s) 506 (with the high input) discharges the gate of output N-FET 522, and also the source of output N-FET 522. More specifically, the respective bottom N-FET(s) 508 and top N-FET(s) 510 conduct. The bottom N-FET(s) 508 discharges the gate voltage on the output N-FET 522 to ground. The top N-FET(s) 510 discharges the source voltage on output N-FET 522 to ground through the bottom N-FET(s) 508. As with input combination 604, the output N-FET 522 does not conduct so long as the source discharge rate is less than or equal to the gate discharge rate. Assuming the output N-FET 522 does not conduct, the node 532 remains at the pre-charge voltage $v_{dd}$. Inverter 524 inverts the $v_{dd}$ voltage on node 532, producing in a relative low voltage at output node 536, as during the low clock cycle 527.

As stated, the output N-FET 522 does not conduct for the input combination 608 as long as the source discharge rate is less than or equal to the gate discharge rate. This is facilitated because the source discharge path has at least twice the resistance to ground as the gate discharge path. This occurs because the source voltage on N-FET 522 discharges through two FETs (top FET 510 and bottom FET 508), and the gate voltage on N-FET 522 discharges through only one FET (bottom FET 508), for each evaluation circuit 506 that has a high input.

As shown in table 600, the input combination 602 is the only one that causes the output N-FET 522 to conduct. This discharges the pre-charge voltage on node 532, resulting in a voltage high on output node 536. Input combination 602 is in1 at a voltage high and in2–inN all at a voltage low. This represents the all zero scenario for the n-bit word assuming the selected bit (in1) is defined with the high-inactive convention, and the non-selected bits are defined with the high-active convention. The remaining input combinations do not cause output N-FET 522 to conduct, and therefore result in a voltage low at node 536.

NOR gate 500 does not have the time-ambiguity that was described for the conventional NOR gate 200. It is recalled that the conventional NOR gate 200 generates an output voltage for the all-zero scenario that is the same as the pre-charge voltage. It is difficult to distinguish the pre-charge condition from the all-zero scenario when using the conventional NOR gate 200, and therefore the conventional NOR gate 200 requires a synchronization event before the output can be accurately sampled. In contrast, the NOR gate 500 produces a voltage transition from low to high at the output node, if and only, the inputs represent the all-zero scenario. For every other input combination, NOR gate 500 maintains a distinguishable voltage low at the output node that is a continuation of the pre-charge condition. Therefore, NOR gate 500 does not require a synchronization event because the output for the all-scenario is distinct from the pre-charge condition.

As stated, N-FET 500 assumes the sending circuit (e.g., comparator 130) generates the n-bit word using the high-inactive convention for the selected bit, and the high-active convention for the non-selected bits. This can be done by inverting the selected bit before it is sent. Alternatively, the sending circuit can generate the entire n-bit word using high-active convention. In which case, an inverter at the NOR gate defines the selected bit. This alternate embodiment is illustrated by NOR gate 700 in FIG. 7A.

Figure 7A:
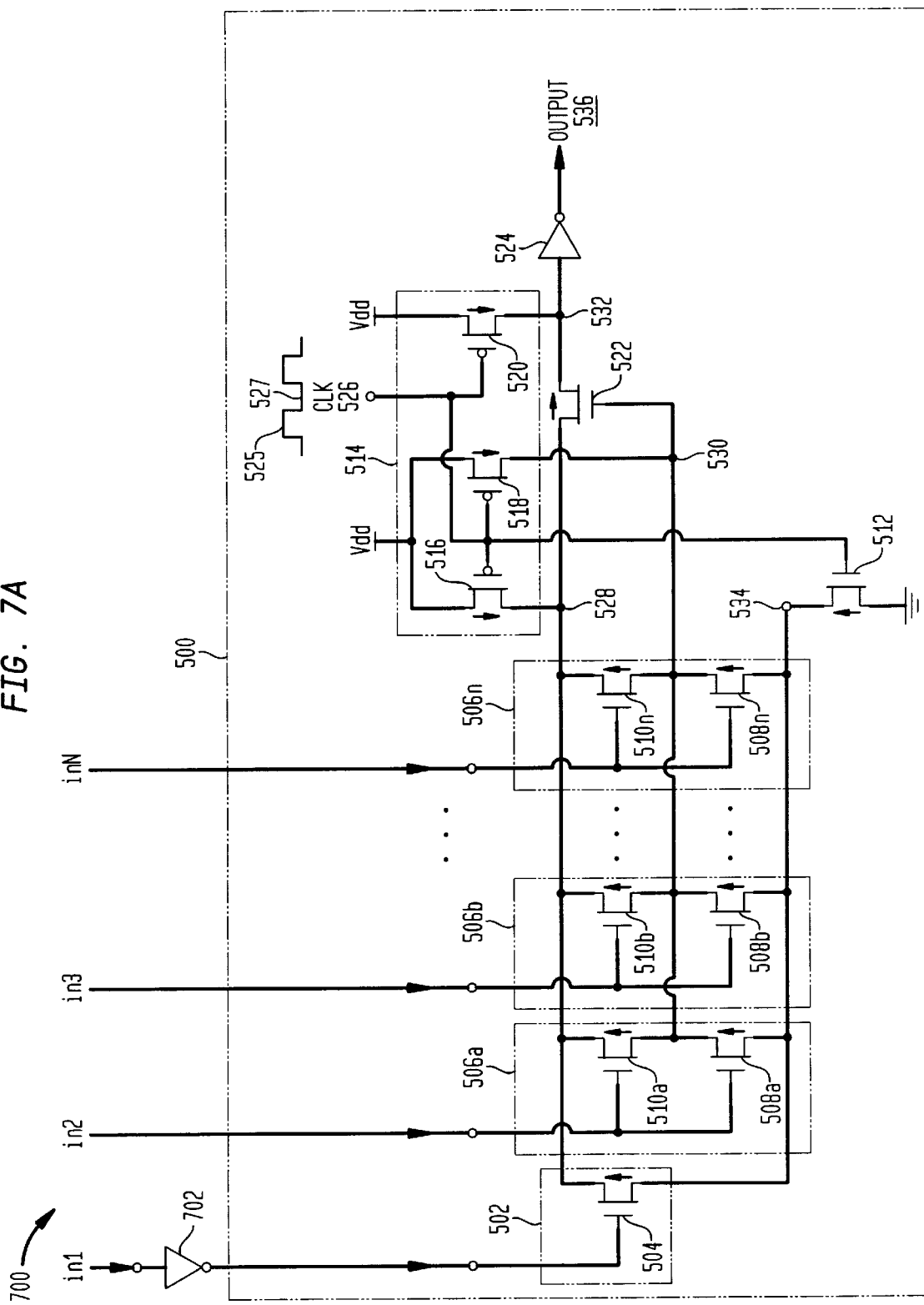
FIG. 7A is a diagram of an output synchronization-free NOR gate 700, according to an embodiment of the present invention.

Referring now to FIG. 7A, NOR gate 700 includes NOR gate 500, and inverter 702. Inventor 702 defines the selected bit by inverting the selected bit prior to evaluation by NOR gate 500. For NOR gate 700, the selected bit is in1. However, as discussed previously, the invention allows for any bit to be chosen as the selected bit including but not limited to LSB or the MSB. (The single FET structure of evaluation circuit 502 follows the selected bit.) NOR gate 500 in FIG. 7A operates the same as that described in FIG. 5, to which the reader is directed for further details. Table 704 in FIG. 7B, summaries the input combinations, results, and the operation of NOR gate 700.

NOR gate 500 and NOR gate 700 can be converted to OR gates by adding an inverter to their respective outputs. Alternatively, NOR gate 500 and NOR gate 700 can be converted to OR gates by removing the inverter 524, and sampling the output from node 532.

6. High Fan-In NOR Gate Improvements

As shown in Table 600, NOR gate 500 is designed so that output N-FET 522 conducts only for the input combination 602. For the remaining input combinations 604–608, output N-FET 522 should not conduct. To prevent conduction, the gate-to-source voltage ($V_{GS}$) for output N-FET 522 should be a relative low voltage that is below the device threshold voltage. During practical circuit operations, intermittent voltage spikes can occur in the output N-FET 522 $V_{GS}$. These voltage spikes can result in unintentional spurious conduction of output N-FET 522.

Spurious conduction of output N-FET 522 is of particular concern for input combination 604, where in1 is high and one or more of in2–inN are high. As discussed above, both the source and the gate of N-FET 522 are simultaneously discharged for input combination 604. If the source voltage drops sufficiently below the gate voltage during the discharge, then output N-FET 522 may spuriously conduct until a steady state condition is reached. This may lead to an erroneous indication of the all-zero scenario on the output node 536.

Spurious conduction during input combination 604 is further depicted in FIGS. 8A–8F, which illustrates various example signal diagrams that are associated with NOR gate 500. More specifically, FIG. 8A illustrates clock signal 526 having high clock cycles 804 and 806. FIG. 8B illustrates signal 808, which represents the selected bit in1. FIG. 8C illustrates signal 810, which represents non-selected bits in2–inN. FIG. 8D illustrates gate signal 812, which represents the voltage on node 530 (i.e., the gate of N-FET 522). FIG. 8E illustrates source signal 814, which represents the voltage at node 528 (i.e., source of N-FET 522). FIG. 8F illustrates $V_{GS}$ signal 816, which is the gate-to-source voltage for N-FET 522 based on gate signal 812 and source signal 814. It will be noted that FIGS. 8A–8F are all on the same time scale.

During high cycle 804, signal 808 (in1) is high and signal 810 (in2–inN) is low, which is the all-zero input scenario for NOR gate 500. Gate signal 812 remains high, and source signal 814 discharges to a low voltage. Therefore, $V_{GS}$ signal 816 has a peak 818 during the high clock cycle 804 that exceeds the device threshold voltage. This causes output N-FET 522 to conduct and discharge output node 532, as is intended for the all-zero scenario.

During high cycle 806, signal 808 (in1) is high, and signal 810 (in2–inN) is also high. This represents the input combination 604, where in1 is at a voltage high, and one or more of signals in2–inN are at a voltage high. Input combination 604 causes gate signal 812 and source signal 814 to discharge to a low voltage, as illustrated in FIGS. 8D and 8E, respectively. Preferably, $V_{GS}$ signal 816 maintains a low voltage during the discharge so that N-FET 522 does not conduct. This is generally depicted in FIG. 8F, but signal 816 has a voltage spike 820 that occurs when the source signal 814 discharges faster than gate signal 812. Voltage spike 820 may potentially cause the spurious conduction of output N-FET 522, if it exceeds the threshold value for output N-FET 522.

The solution to the above mentioned problem is to insure that the source voltage on output N-FET 522 discharges slower than that of gate voltage. This can be done by adding capacitance (and therefore more charge) to the source node 528, or by adding resistance in the source discharge path. The circuits in FIGS. 9 and 10 implement one or more of these improvements, in order to prevent the unintentional conduction of the output N-FET 522. None of the these improvements alter the overall operation of the NOR gate, as depicted in table 600 of FIG. 6.

Figure 9:
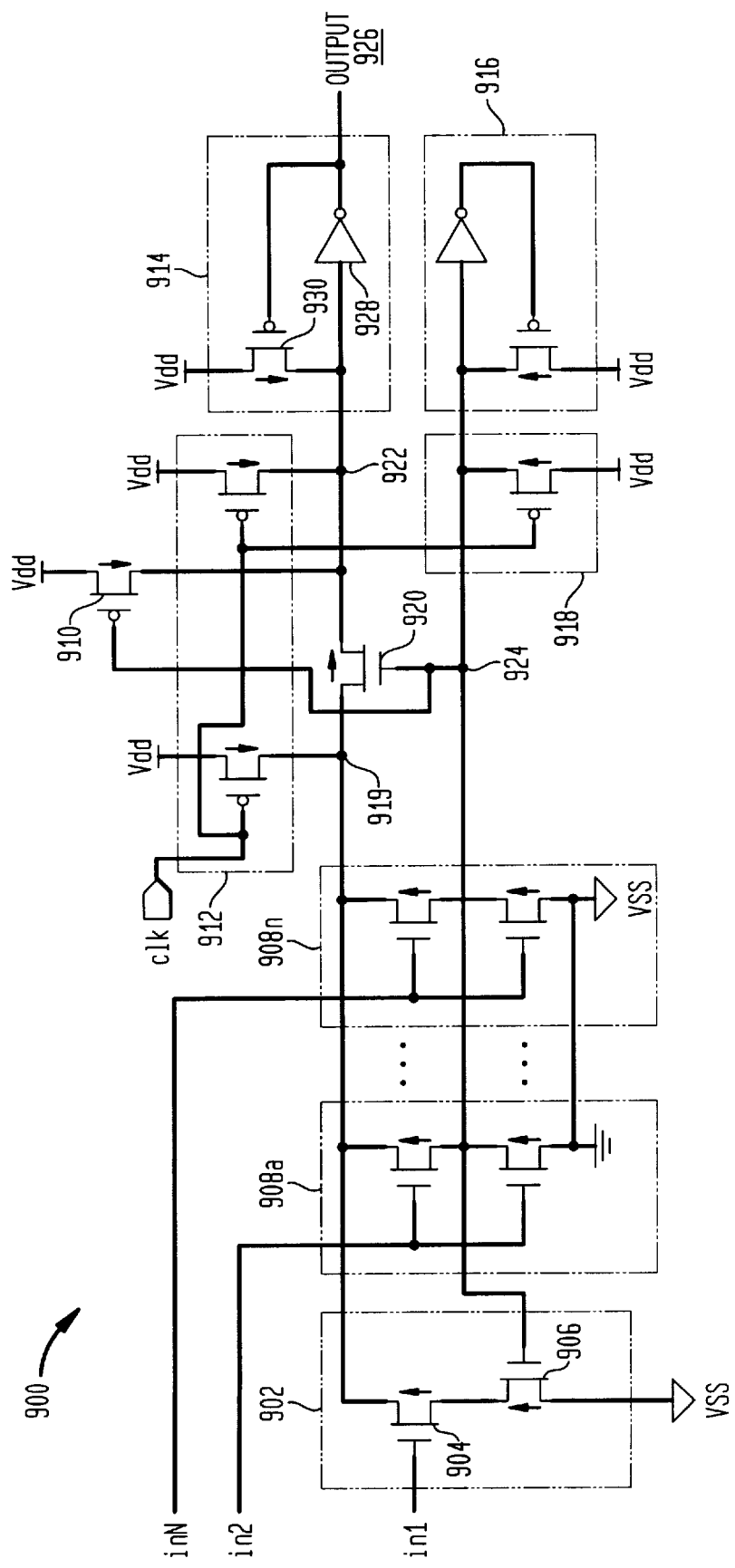
FIG. 9 illustrates a diagram of an output synchronization-free NOR gate 900, according to an embodiment of the present invention.

FIG. 9 illustrates a NOR gate 900, which is a variation of a NOR gate 500 that has improved performance for the input combination 604. NOR gate 900 includes: an evaluation circuit 902, evaluation circuits 908a–n, a pre-charge circuit 912, a P-FET 910, restoration circuits 914,916, a pre-charge circuit 918, and output N-FET 920. Pre-charge circuits 912 and 918, evaluation circuits 908a–n, and an output N-FET 920 operate similar to pre-charge circuit 514, evaluation circuits 506a–n, and output N-FET 522 in NOR gate 500, respectively; to which the reader is referred for a more detailed discussion. Evaluation circuit 902, restoration circuits 914,916, and P-FET 910 are explained below.

Evaluation circuit 902 includes a top N-FET 904 that is coupled to a bottom N-FET 906. The drain of bottom N-FET 906 is coupled to the source of top N-FET 904. The gate of top N-FET 904 is controlled by the selected bit in1, so that top N-FET 904 evaluates the selected bit similar to N-FET 504 in NOR gate 500. The gate of bottom N-FET 906 is coupled to node 924, which is the gate of output N-FET 920.

Evaluation circuit 902 prevents the spurious conduction of output N-FET 920 for input combination 604 (in1 at voltage high, and one or more of in2–inN at a voltage high). For in1 at a voltage high, evaluation circuit 902 discharges the source of output N-FET 920 through top N-FET 904 and bottom N-FET 906. More specifically, top N-FET 904 conducts and shorts to bottom N-FET 906. Bottom N-FET 906 acts as a variable resistance between the top N-FET 904 and ground, where the resistance is controlled by the gate voltage on output N-FET 920. This occurs because the gate of bottom N-FET 906 is tied to the gate of output N-FET 920. For input combination 604, the gate of output N-FET 920 is simultaneously discharged to ground by one or more of evaluation circuits 908a–n. This causes the resistance of bottom N-FET 906 to increase as the gate of output N-FET 920 discharges. In other words, the resistance of N-FET 906 varies inversely with the gate voltage on output N-FET 920. Therefore, the resistance from the source of output N-FET 920 to ground increases as the gate voltage on output N-FET 920 falls. This acts to slow the discharge of the source voltage relative to the gate voltage on output N-FET 920, and prevents the spurious conduction of output N-FET 920.

Restorative circuits 914, 916 operate to reduce voltage fluctuation on nodes 922,924, respectively, that are caused by noise sources. For example, pre-charge circuit 912 charges node 922 to a pre-charged voltage $v_{dd}$ during the low clock cycle. During the high clock cycle, node 922 (output FET drain) remains at the pre-charge voltage $v_{dd}$ for all input combinations except for the all-zero scenario. NOR gate 500 relied on the various FET capacitances to hold voltage on drain of the output N-FET 522. Restorative circuit 914 provides an additional voltage source to charge node 922 during the high clock cycle, when node 922 is supposed to hold a charge. More specifically, inverter 928 inverts the voltage $v_{dd}$ on node 922 to a voltage low, which causes P-FET 930 to conduct and supply more voltage to node 922. In other words, restorative circuit 914 is a voltage feed-back loop. Any noise fluctuation that drops the voltage on node 922 is restored by restorative circuit 914. When node 922 is discharged to ground (as during the all-zero scenario), inverter 928 inverts the low voltage to a high voltage. This cuts-off P-FET 930 and prevents P-FET 930 from supplying more voltage to node 922. Restorative circuit 916 operates to restore voltage on node 924 in a manner similar to that of restorative circuit 914, as will be understood by those skilled in the arts based on the discussion herein.

P-FET 910 also acts as a restorative circuit to restore charge to node 922 in the event of some spurious discharge under the case of input combination 604. The gate of P-FET 910 is connected to node 924, and therefore P-FET 910 only supplies charge to node 922 if node 924 discharges. P-FET 910 is cutoff, and does not supply charge for input combination 602.

Figure 10:
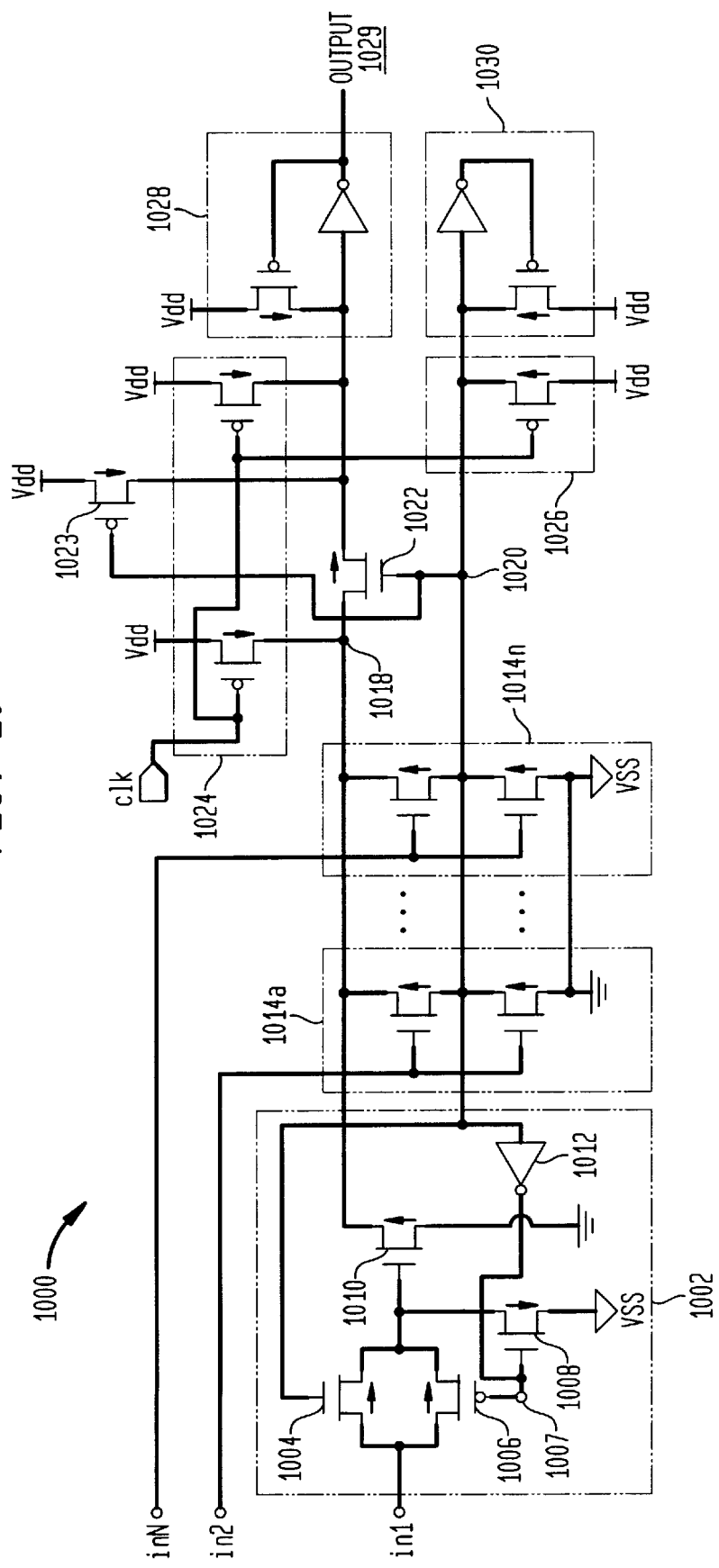
FIG. 10 illustrates a diagram of an output synchronization-free NOR 1000, according to an embodiment of the present invention.

FIG. 10 illustrates NOR gate 1000, which is another variation of NOR gate 500 that has improved performance for the input combination 604. NOR gate 1000 includes: an evaluation circuit 1002; evaluation circuits 1014a–n; a pre-charge circuit 1024; restoration circuits 1028,1030; a P-FET 1023; a pre-charge circuit 1026; and an output N-FET 1022.

Evaluation circuits 1014a–n, output N-FET 1022, and pre-charge circuits 1024, 1026 operate similar to evaluation circuits 506a–n, output N-FET 522, and pre-charge circuit 514 in NOR gate 500, respectively; to which the reader is referred for a more detailed discussion. Restoration circuits 1028, 1030 operate similar to restoration circuits 914, 916, respectively; to which the reader is referred for a more detailed discussion. P-FET 1023 operates similar to P-FET 910; to which the reader is referred for a more detailed discussion. Evaluation circuit 1002 is discussed in detail below.

Evaluation circuit 1002 prevents the spurious conduction of output N-FET 1022 for the input combination 604. As with evaluation circuit 902, evaluation circuit 1002 acts as a variable resistor between the source of N-FET 1022 and ground, where the resistance varies inversely with the gate voltage on the output N-FET 1022 (node 1020). In other words, the resistance of evaluation circuit 1002 increases as the gate voltage drops on N-FET 1022. The operation of evaluation circuit 1022 will be described below for both a voltage high on node 1020, and a voltage low on node 1020.

When there is a voltage high on node 1020 (i.e., as is the case for input combinations 602 and 606), then inverter 1012 inverts the voltage high to generate a voltage low on node 1007. The voltage low on node 1007 causes P-FET 1006 to conduct and N-FET 1008 to cutoff. The voltage high on node 1020 also causes N-FET 1004 to conduct. The result is an approximate short from in1 to the gate of N-FET 1010. N-FET 1010 evaluates in1 and provides the discharge path for the source of N-FET 1022 similar to that N-FET 504 in NOR gate 500.

When there is a voltage low on node 1020 (i.e., as for input combination 604), then inverter 1012 inverts the voltage low to generate a voltage high on node 1007. The voltage high on node 1007 cuts-off the P-FET 1006, and causes the N-FET 1008 to conduct. Also, the voltage low on node 1020 causes N-FET 1004 to cut-off. The result is two high resistance cutoff FETs (N-FET 1004 and P-FET 1106) between in1 and the gate of N-FET 1010. Furthermore, conducting N-FET 1008 provides a low resistance path to ground that is in parallel with FET 1010. As such, the signal power of in1 at N-FET 1010 will be much attenuated. This reduces the ability of in1 to cause N-FET 1010 to conduct, and therefore increase the resistance of FET 1010. Since N-FET 1010 is the source discharge path for output N-FET 1022, this slows the discharge of the source voltage on output N-FET 1022, relative to the discharge of the gate voltage on output N-FET 1022. This prevents the spurious conduction of output N-FET 1022 when the gate and source voltages on output N-FET 1022 simultaneously discharge, as in input combination 604.

In addition to implementations of the invention using hardware, the invention can also be embodied in an article of manufacture comprised of a computer usable medium configured to store a computer-readable program code. The program code causes the enablement of the functions or fabrication, or both, of the hardware disclosed in this specification. For example, this might be accomplished through the use of general programming languages (e.g., C, C++, and so on), hardware description language (HDL), register transfer language (RTL), Verilog HDL, VHDL, AHDL (Altera hardware description language), or other programming and/or circuit (i.e., schematic) capture tools available in the art. A book entitled "A Verilog HDL Primer" by J. Bhasker, Star Galaxy Pr., 1997 provides greater detail on Verilog HDL, and is incorporated herein by reference in its entirety for all purposes.

It is understood that the functions accomplished by the invention as described above could be represented in a core which could be utilized in programming code and transformed to hardware as part of the production of integrated circuits. Also, other implementations of the invention, using a combination of hardware and software are also possible. Therefore, the embodiments expressed above are within the scope of the invention and should also be considered protected by this patent.

7. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for detecting an all-zero scenario for a n-bit word having a selected bit and (n−1) non-selected bits, the method comprising:

generating a pre-charge voltage; and evaluating a logic state of the selected bit using a first convention and logic states of each of the non-selected bits using a second convention, said evaluating step including (a) determine a voltage of the selected bit, and a voltage of each of the non-selected bits, (b) discharging the pre-charge voltage if the selected bit is a first voltage and each of the non-selected bits is a second voltage, whereby the discharge of the pre-charge voltage indicates the all-zero scenario, and maintaining the pre-charge voltage if at least one of the following conditions is met (I) the selected bit is said second voltage, and (ii) at least one of the non-selected bits is said first voltage.

2. The method of claim 1, wherein the first convention represents a logic "0" as a voltage high and represents a logic "1" as a voltage low, wherein the second convention represents a logic "0" as a voltage low and represents a logic "1" as a voltage high, wherein the first voltage is a voltage high, and wherein the second voltage is a voltage low.

3. A NOR gate for evaluating a n-bit word having a selected bit and (n−1) non-selected bits, the NOR gate comprising:

an output FET;

a pre-charge circuit for charging a gate, a drain, and a source of said output FET to a pre-charge voltage;

first evaluation circuit, coupled to said source of said output FET, for evaluating said selected bit;

(n−1) second evaluation circuits corresponding to said (n−1) non-selected bits, each of said second evaluation circuits being coupled to said gate of said output FET; and wherein, if said selected bit is a first voltage and each of said (n−1) non-selected bits is a second voltage, then said first evaluation circuit discharges said pre-charge voltage on said source of said output FET, and each of said second evaluation circuits maintains said pre-charge voltage on said gate of said output FET, thereby causing said output FET to conduct and discharge said drain of said output FET, whereby discharging said drain of said output FET indicates an all-zero scenario.

4. The NOR gate of claim 3, wherein said first voltage is a voltage high and said second voltage is a voltage low.

5. The NOR gate of claim 3, wherein if said selected bit is said second voltage and said (n−1) non-selected bits are said second voltage, then said first evaluation circuit maintains said pre-charge voltage on said source of said output FET, thereby preventing said output FET from conducting, and thereby maintaining said pre-charge voltage on said drain of said output FET.

6. The NOR gate of claim 3, wherein if any one of said non-selected bits is said first voltage, then said corresponding second evaluation circuit discharges said gate of said output FET, thereby preventing said output FET from conducting, and thereby maintaining said pre-charge voltage on said drain of said output FET.

7. The NOR gate of claim 3, wherein:

said first evaluation circuit comprises a first FET, wherein a gate of said first FET is controlled by said selected bit, a drain of said first FET is coupled to said source of said output FET, and a source of said first FET is coupled to ground; and each of said second evaluation circuits comprises a second FET and a third FET, wherein a gate of said second FET and a gate of said third FET are controlled by said corresponding non-selected bit, a drain of said second FET is coupled to said source of said output FET, a source of said second FET is coupled to a drain of said third FET, said drain of said third FET is coupled to said gate of said output FET, and a source of said third FET is coupled to ground.

8. The NOR gate of claim 7, wherein if said selected bit is said first voltage and each of said non-selected bits is said second voltage, then said first FET conducts and discharges said pre-charge voltage on said source of said output FET, each of said second and third FETs remains non-conducting and maintains said pre-charge voltage on said gate of said output FET, thereby causing said output FET to conduct, and thereby discharging said pre-charge voltage on said drain of said output FET through said first FET to ground.

9. The NOR gate of claim 7, said first evaluation circuit further comprising a fourth FET coupled between said first FET and ground, a drain of said fourth FET coupled to said source of said first FET, a source of said fourth FET coupled to ground, a gate of said fourth FET coupled to said gate of said output FET.

10. A system for detecting an all-zero scenario for a n-bit word having a selected bit and (n−1) non-selected bits, the system comprising:

an output FET;

pre-charging means for pre-charging a gate, a drain, and a source of said output FET;

first evaluation means for evaluating said selected bit, wherein said first evaluation means discharges said pre-charge voltage on said source of said output FET when said selected bit is a first voltage;

second evaluation means for evaluating said non-selected bits, wherein said second evaluation means maintains said pre-charge voltage on said gate of said output FET when said (n−1) non-selected bits are a second voltage; and wherein said output FET conducts when said gate of said output FET is pre-charged and said source of said output FET is discharged, thereby discharging said pre-charge voltage on said drain of said output FET, whereby discharging said output FET drain indicates the all-zero scenario.

11. The system of claim 10, wherein said first voltage is a voltage high, and said second voltage is a voltage low.

12. The system of claim 10, wherein said first evaluation means maintains said pre-charge voltage on said source of said output FET when said selected bit is said second voltage and each of said non-selected bits is said second voltage, thereby preventing said output FET from conducting.

13. The system of claim 10, wherein said second evaluation means discharges said pre-charge voltage on said gate of said output FET when one or more of said non-selected bits are said first voltage, thereby preventing said output FET from conducting.

14. The system of claim 10, wherein said first evaluation means comprises a means for adjusting a rate of voltage discharge on said source of said output FET, based on a current voltage on said gate of said output FET.

15. A method for detecting a certain value for a n-bit word, the method comprising:
   inverting a selected bit;
   generating a pre-charged voltage;
   evaluating a logic state of the inverted selected bit using a first convention, and a logic state of a non-selected bit using a second convention, said evaluating including:
   (a) determining a voltage of the inverted selected bit, and a voltage of the non-selected bit, and
   (b) discharging the pre-charge voltage if the inverted selected bit is a first voltage, and the non-selected bit is a second voltage, whereby the discharge of the pre-charge voltage indicates the certain value, and
   (c) maintaining the pre-charge voltage if at least one of the following conditions is met
      (I) the inverted selected bit is said second voltage, and
      (ii) at least one of the non-selected bits is said first voltage.

16. The method of claim 15, wherein said first convention represents a logic "0" as a voltage high and represents a logic "1" as a voltage low, wherein said second convention represents a logic "0" as a voltage low and represents a logic "1" as a voltage high, wherein said first voltage is a voltage high, and wherein said second voltage is a voltage low.

17. A logic gate, comprising:
   an output FET, a drain of said output FET coupled to an output of said logic gate;
   a pre-charge circuit coupled to a gate, a source, and said drain of said output FET;
   a first evaluation circuit comprising a first FET, a drain of said first FET coupled to said source of said output FET, a source of said first FET coupled to ground, a gate of said first FET coupled to a first input; and
   a second evaluation circuit comprising a second FET, a drain of said second FET coupled to said gate of said output FET, a source of said second FET coupled to ground, and a gate of said second FET coupled to a second input.

18. The logic gate of claim 17, wherein said second evaluation circuit further comprises a third FET, a drain of said third FET coupled to said source of said output FET, a source of said third FET coupled to said drain of said second FET, and a gate of said third FET coupled to said second input.

19. The logic gate of claim 17, further comprising an inverter, an input of said inverter coupled to said drain of said output FET, an output of said inverter coupled to said output of said logic gate.

20. The logic gate of claim 17, wherein said first evaluation circuit further comprises a third FET coupled between said first FET and ground, a drain of said third FET coupled to said source of said first FET, a source of said third FET coupled to ground, a gate of said third FET coupled to said gate of said output FET.

21. The logic gate of claim 17, wherein said first evaluation circuit further comprises a third FET, a fourth FET, and a fifth FET, said third FET and said fourth FET coupled between said first input and said gate of said first FET, a gate of said third FET coupled to said gate of said output FET, a gate of said fourth FET coupled to an output of an inverter, an input of said inverter coupled to said gate of said output FET, said fifth FET coupled between said gate of said first FET and ground, a gate of said fifth FET coupled to said output of said inverter.

* * * * *

UNITED STATES PATENT AND TRADEMARK OFFICE
CERTIFICATE OF CORRECTION

PATENT NO.   : 6,188,248 B1
DATED        : February 13, 2001
INVENTOR(S)  : Jimmy Lee Reaves It is certified that error appears in the above-identified patent and that said Letters Patent is hereby corrected as shown below:

<u>Column 15,</u>
Line 27, before "a voltage", replace "determine" with -- determining --;
Line 34, before "maintaining", insert -- (c) --;
Line 36, before "the selected", replace "(I)" with -- (i) --; and <u>Column 17,</u>
Line 32, before "the inverted", replace "(I)" with -- (i) --.

Signed and Sealed this

Twenty-sixth Day of February, 2002

Attest:

*Attesting Officer*

JAMES E. ROGAN
*Director of the United States Patent and Trademark Office*